United States Patent [19]

Hill et al.

[11] 3,944,906
[45] Mar. 16, 1976

[54] DETECTOR DEVICE FOR CONVERTING A.C. INPUTS TO AN D.C. OUTPUT AND A SYSTEM FOR USING THE SAME

[75] Inventors: Frank W. Hill, Moline, Ill.; Theodore A. Hedman, Fort Collins, Colo.

[73] Assignee: Gulf & Western Industries, Inc., New York, N.Y.

[22] Filed: Oct. 7, 1974

[21] Appl. No.: 512,571

[52] U.S. Cl. .................... 321/8 R; 324/119; 328/26; 328/147; 328/150
[51] Int. Cl.² .......................................... H02M 7/00
[58] Field of Search .......... 321/8 R; 328/26, 28, 32, 328/147, 149, 150; 324/119

[56] References Cited
UNITED STATES PATENTS

| | | |
|---|---|---|
| 3,530,385 | 9/1970 | Smith et al. .................... 328/151 X |
| 3,569,842 | 3/1971 | Schroyer ........................ 328/149 X |
| 3,867,702 | 2/1975 | Torpie et al. ..................... 328/26 X |

OTHER PUBLICATIONS

*Applications Manual for Operational Amplifiers:* Philbrick/Nexus Research; Dec. 1965, Figs. 3, 17(a)(b).

*Primary Examiner*—Gerald Goldberg
*Attorney, Agent, or Firm*—Meyer, Tilberry & Body

[57] ABSTRACT

An input detection circuit to provide a D.C. output signal of a selected value upon receipt of an input A.C. signal of a given value on an input line. The detector circuit includes a NORTON type current responsive operational amplifier having an inverted input terminal, a non-inverted input terminal and an output terminal. A circuit is provided at the inverted terminal for biasing the amplifier to provide an output voltage on the output terminal substantially less than the selected output signal. A full wave rectifier connected to the input line and having a first output conductive during the negative portion of an A.C. signal applied to the input line and a second output conductive during the positive portion of an A.C. signal applied to the input line. There is provided a first resistor for connecting the first output of the rectifier to the inverted terminal and a second resistor for connecting the second output to the non-inverted terminal. In addition, there is a system for detecting the existence of concurrent A.c. inputs from at least one of each of two groups of A.C. inputs using the detector device as described above.

10 Claims, 7 Drawing Figures

FIG. 4
| I- AND I+ RELATIONSHIP | A |
|---|---|
| I- = 0 | H |
| I- ≤ I+ | H |
| I- > I+ | L |
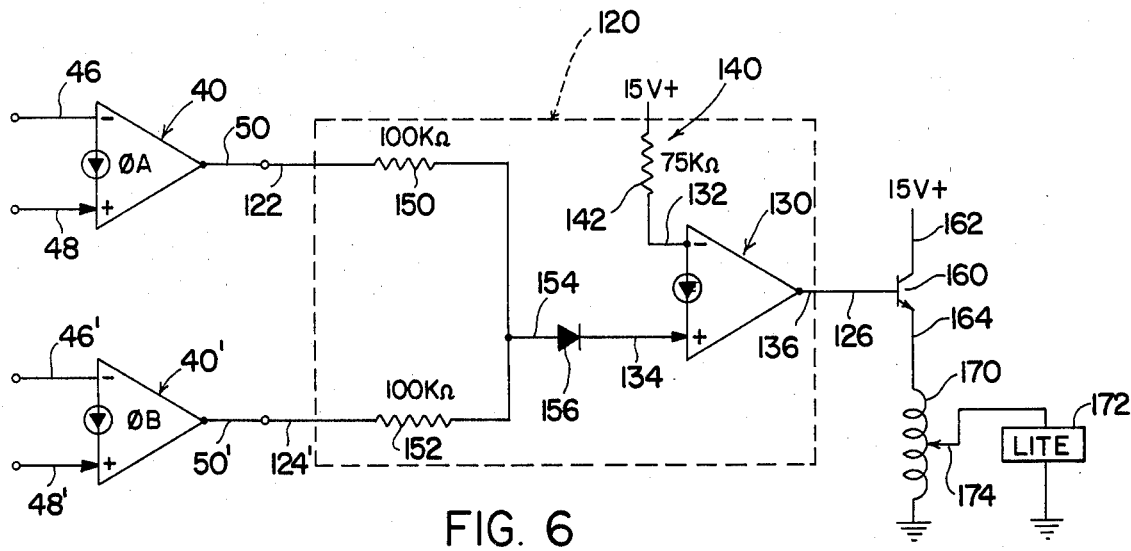
FIG. 6
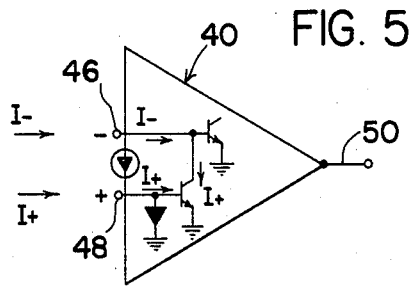
FIG. 5

DETECTOR DEVICE FOR CONVERTING A.C. INPUTS TO AN D.C. OUTPUT AND A SYSTEM FOR USING THE SAME

This invention relates to the art of detector devices for detecting the existence of an input signal of the type used in traffic controllers and more particularly to a detector device for converting A.C. inputs to D.C. output and a system for using this type of detector device.

The invention is particularly applicable for the detection of conflicting conditions in a traffic controller and will be described with particular reference thereto; however, it is appreciated that the present invention has broader applications and may be used in various environments wherein a A.C. signal is detected and produces a D.C. output usable for a digital system.

As is well known, a substantial amount of development work has been devoted to the art of traffic controllers which have advanced from cam operated fixed time systems to traffic responsive systems employing analog computers, process controllers and digital computers. In these systems, circuitry is utilized which prevents a conflict between right-of-way signals in the various traffic phases being controlled. In addition, the more advanced traffic controllers require the detection of a given condition for use in the total controlled function of a controller. In both of these instances, the detected signal or condition is considered an input to the total system and is often in the form of a line current being applied to a given portion of the traffic control system. This line current is generally 110 volts alternating current. In the more advanced traffic controllers, binary logic is used for the control functions; therefore, the alternating current inputs which are to be detected and used in the traffic controller must be converted to binary information which is generally a low logic for the non-existence of an input condition and high logic for the existence of an input condition. The present invention is directed toward a detection device for detecting the existence of an alternating current input condition and converting this alternating current input to a D.C. output usable in a digital, binary system.

In the past, a capacitor input circuit was often used for converting A.C. input to a D.C. binary, digital output. The voltage level of prior systems was often dependent upon some type of Zener diode or transistor used as a voltage limiting device. In such applications, half wave A.C. sensing would result in a higher voltage level than full wave A.C. sensing. As inputs were added in parallel with a detecting system, the sensing level and response was sometimes shifted or modified. In an attempt to overcome some of the disadvantages of prior detector circuits of the type described above, various combinations of transistors and resistors have been attempted. In these instances, the circuits were expensive, or involved critical selection of resistors and transistors. In addition, variations in the operating voltage or the temperature of the circuit often caused shift in the tripping or sensing voltage of the detector circuit.

These disadvantages have been overcome by the present invention which relates to a solid state coverting and detecting circuit utilizing no input capacitors and no Zener diodes or other voltage limiting devices. In accordance with the invention, all types of alternating current inputs, such as positive half wave, negative half wave and full wave inputs are sensed in accordance with essentially the same tripping point. By using the present invention, a number of alternating current inputs can be placed in parallel without affecting the parameters of the detection circuit.

In accordance with the invention, there is provided an input detection circuit to provide a D.C. output signal of a selected value upon receipt of an A.C. signal having a given value on an input line. This circuit includes a current responsive operational amplifier having an inverted input terminal, a non-inverted input terminal and an output terminal. Such amplifiers are known as NORTON operational amplifiers. Means connected to the inverted terminal are provided for biasing the amplifier to produce an output voltage on the output terminal of the amplifier which is substantially less than the selected value. A full wave rectifier is connected to the input line and has a first output which is conductive during the negative portion of an A.C. signal applied to the input line and a second output which is conductive during the positive portion of an A.C. signal applied to the input line. By then providing a first resistor for connecting the first rectifier output to the inverted terminal of the operational amplifier and a second resistor for connecting the second output of the rectifier to the non-inverted terminal of the amplifier, a complete detecting system is created which detects and converts an A.C. input to a digital or binary D.C. output.

In accordance with another aspect of the present invention, a device of the type described above is used in a system for detecting the existence of concurrent A.C. inputs from at least one of each of two groups of A.C. inputs. By this device, several groups of inputs can be monitored simultaneously to indicate the existence of a conflict of sensed inputs in each of two conflicting groups of inputs. This system is highly useful in a traffic controller to indicate and correct any conflicts in right-of-way signals.

The primary object of the present invention is the provision of the detector circuit for detecting A.C. input and providing a D.C. output indicative of an input condition, which circuit is economical to use, positive in operation and causes little shift during use.

Yet another object of the present invention is the provision of a detector circuit for detecting an A.C. input and providing a D.C. output indicative of an input condition, which circuit does not require capacitors and/or Zener diodes.

Yet a further object of the present invention is the provision of a circuit as defined above which is adapted for use in monitoring a group of inputs such as those used in a traffic controller.

These and other objects and advantages will become apparent from the following description taken together with the accompanying drawings in which:

FIG. 4 is a truth table for a NORTON current responsive operational amplifier;

FIG. 5 is a schematic diagram of a NORTON current responsive operational amplifier; and, FIG. 6 is a schematic wiring diagram illustrating the system employing the preferred embodiment of the invention as illustrated in FIG. 1.

Figure 1:
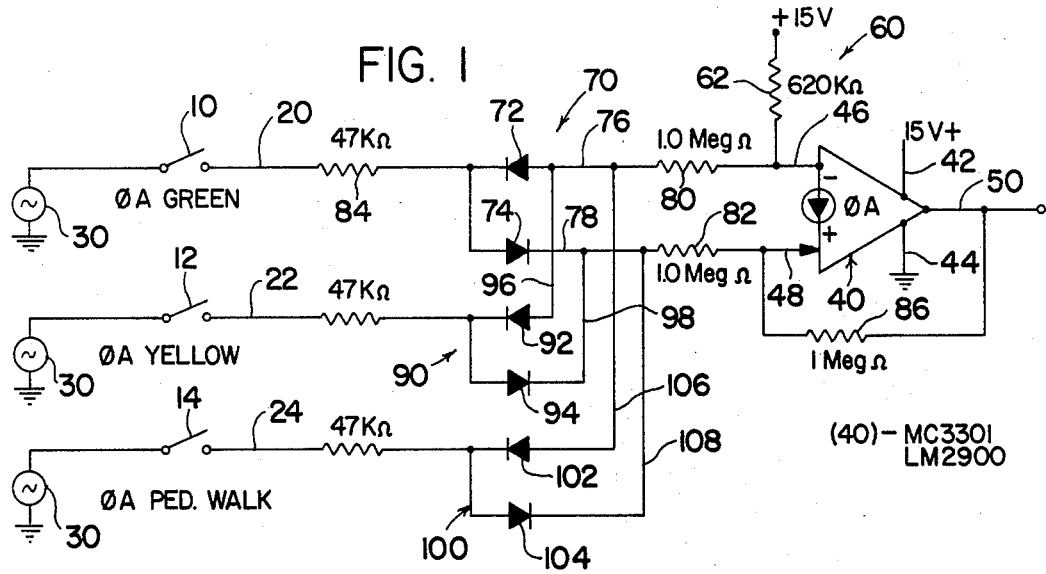
FIG. 1 is a schematic wiring diagram illustrating the preferred embodiment of the present invention.

Referring now to the drawings wherein the showings are for the purpose of illustrating a preferred embodiment of the invention only and not for the purpose of limiting the same, FIG. 1 shows an input detector circuit A for use on a single traffic phase of a traffic controller, designated as phase A. The detector circuit A is used to detect existence of one or more of several inputs 10, 12, 14, represented schematically as switches in input lines 20, 22, 24. The A.C. power supply to the input lines is schematically illustrated as 110 volt A.C. line current power supply 30.

A preferred embodiment of the present invention can be used with a single input line, such as line 20 and will be described with particular reference for the detection of an A.C. input signal on this line. The detector circuit uses a current responsive operational amplifier 40, which has been developed recently and is generally designated as a NORTON operational amplifier. Amplifier 40 has an input voltage terminal 42, a ground terminal 44, and inverted input terminal 46, a non-inverted input terminal 48 and an output terminal 50. The symbolism for the NORTON operational amplifier shown in FIG. 1 is the standard adopted symbolization for this type of solid state device.

Figure 3:
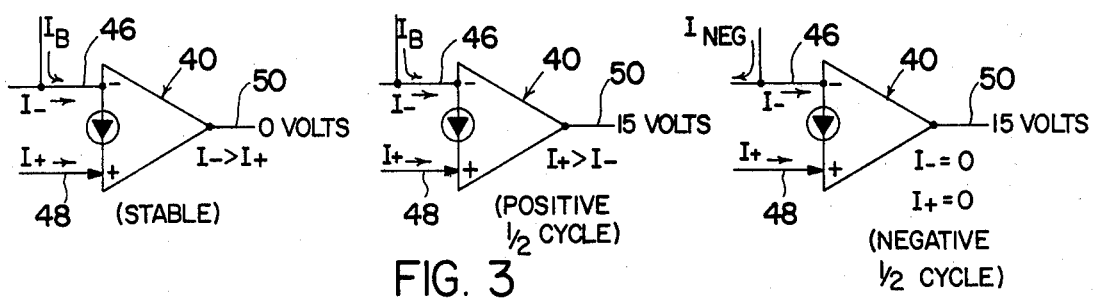
FIG. 3 shows a series of operating characteristics for the NORTON current responsive operational amplifier used in the present invention.

The general schematic diagram of a NORTON amplifier is illustrated in FIG. 5 wherein the current input at the non-inverted terminal is indicated at $I_+$ and the current input at the inverted terminal is indicated as $I_-$. In accordance with the standard operation of this device, the lower section of FIG. 5 is indicated as a current mirror and produces a current flow from the inverted terminal which is generally considered to be equal to the current input to the non-inverted terminal. As long as $I_-$ is greater than $I_+$, the output on terminal 50 is at a low logic generally considered to be zero volts. If the current on the inverted terminal, $I_+$, is greater than or equal to $I_-$, the current mirror draws all current from the inverted terminal. This current and the amplifier operates to produce a high logic at the output terminal 50. This high logic is substantially the voltage applied to terminal 42, as shown in FIG. 1. When $I_-$ is zero, the output logic is high since no current is available beyond the current mirror irrespective of the $I_+$ current. These conditions are illustrated in the truth table of FIG. 4 and schematically illustrated to an extent used in the present invention in the diagrams of FIG. 3.

Referring now again to the preferred embodiment of the invention illustrated in FIG. 1, a current supply 60 is provided for biasing amplifier 40 at the inverted terminal 46. This current supply produces a current at terminal 46 determined by resistor 62 and the 15 volt power supply which is substantially greater than the current at the non-inverted terminal 48. Thus, amplifier 40 is biased into the condition having a low logic or zero voltage output at terminal 50, as depicted in the left hand view of FIG. 3 and the lower portion of the truth table shown in FIG. 4. By providing biasing current to terminal 46, the low logic condition exist at the output of terminal 50 until a condition exist wherein the $I_+$ current at the non-inverted terminal 48 equals or exceeds the $I_-$ current at the terminal 46. A full wave rectifier 70 includes diodes 72, 74 and output lines 76, 78. These lines are connected through relatively high value resistors 80, 82 to the input terminals 46, 48, respectively. Resistors 80, 82 change the output of the rectifier to basically current sources. A relatively small resistor 84 is connected between input 10 and rectifier 70 to control current flow during the rectification of the A.C. input when switch 10 is closed. A third current source producing high value resistor 86 is attached between output terminal 50 and the non-inverted input terminal 48 for the purpose of creating a well defined output pulse and introducing a certain amount of hysteresis, as schematically represented by the dashed line portion of FIG. 2A.

Figures 2, 2A:
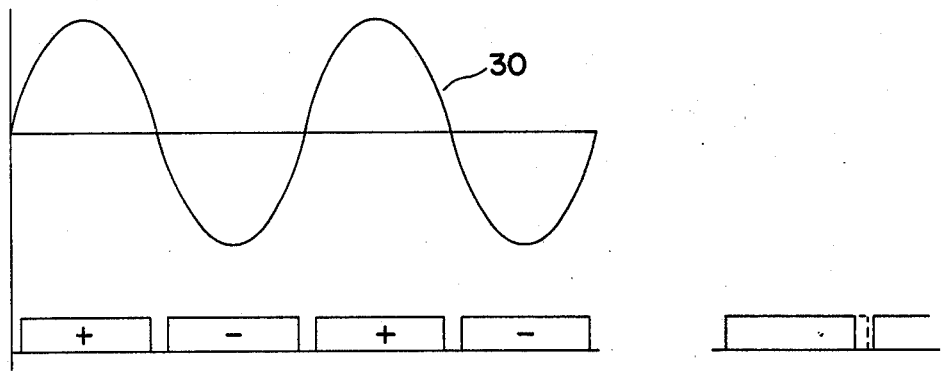
FIG. 2 is a schematic graph illustrating an operating characteristic of the present invention.
FIG. 2A shows a modification of the graph shown in FIG. 2.

During operation, closing of switch 10 applies an alternating current from source 30 to input line 20. Before this happens, biasing current $I_B$ is applied from the biasing source 60 to the inverted terminal, as schematically ilustrated in the left hand view of FIG. 3. In the initial state, substantially no current is introduced to the non-inverted terminal 48. Consequently, the $I_-$ current to the inverted terminal 46 is greater than $I_+$ causing a zero voltage or low logic output condition. This indicates no detection of an alternating current applied by switch 10 of line 20. The biasing current through the 620 kiloohm resistor 62 produces a biasing current of approximately 24 microamps. Assuming now that the switch 10 is closed to energize rectifier 70. During the positive going portion of source 30, diode 74 in the lower subcircuit of the rectifier is conductive and current is applied to terminal 48. When this current $I_+$ equals or exceeds the current $I_-$ at terminal 46, the output at terminal 50 is shifted to a high D.C. level approaching the positive 15 volts applied to terminal 42, as shown in the center view of FIG. 3. At that time, current supplied through resistor 86 causes a rapid increase of the output D.C. voltage on line 50. This assist in shaping the output pulse, as shown in the lower portion of FIG. 2. The output remains at a high logic level at terminal 50 during the remainder of the positive going half cycle of source 30 until the source is insufficient to create enough $I_+$ current at terminal 48 to offset the $I_-$ current from biasing circuit 60. At that time, the output 50 shifts to a low logic output. Again, resistor 86 causes a rapid shift of the output logic at terminal 50. Resistor 86 pumps current into terminal 48; therefore, the point at which the output shifts back to a low logic condition is shifted to the right as shown in FIG. 2A so that the logic shift is at a current where the addition of current from resistor 86 and resistor 82 is insufficient to overcome the biasing current $I_-$ at terminal 46. When the input alternating current in line 20 shifts to the negative half cycle portion, conduction through line 78 and diode 74 is discontinued. A negative voltage is applied to the left of diode 72 in a second subcircuit of rectifier 70. When this negative voltage is sufficiently high, determined by the negative voltage in line 20, current is drawn from the current supply 60 through resistor 80 at a sufficiently high value to decrease the current $I_B$ input at terminal 46 to the level equal to or below the current at terminal 48 which is substantially zero current. When the current during the negative half cycle is decreased at terminal 46 to a sufficient level, there is no $I_-$ current applied to terminal 46. Again, this shifts the output terminal to a high logic approaching the 15 volt input at terminal 42. As soon as a voltage appears at terminal 50, current is supplied through resistor 86 to terminal 48. This provides a sharp voltage increase at the start of the pulse created by a negative half cycle swing in the input alternating current. With current being applied to terminal 48, a hysteresis effect is created. When the negative voltage in line 20 reaches a low level determined by resistors 62, 80, and 84, a current to terminal 46 increases and again causes biasing of amplifier 40 to a low logic condition. Thus, as the input voltage alternates between positive and negative half cycles, a series of high level logic pulses are created as shown in FIG. 2. The sensed A.C. signal must have a sufficient voltage to shift the output of amplifier 40. In the preferred embodiment the tripping point is about 20 volts and supply is a line current 100 volt supply. This provides rapid formation of a series of output pulses, as shown in FIG. 2. These output pulses are a D.C. output signal which can be used as an indicator of the existence of an alternating current in line 20.

Without effecting the parameters as so far described, a series of inputs can be monitored by the circuit A, as illustrated in FIG. 1. To accomplish this, input lines 22 and 24 are connected in parallel with input line 20. Referring now to input line 22, a full wave rectifier 90 includes diodes 92, 94 and output lines 96, 98. These output lines are connected to the corresponding output lines 76, 78 of rectifier 70 and produce an output at terminal 50 in accordance with the previous discussion. The same is true of input line 24 which includes a rectifier 100 having diodes 102, 104, and output lines 106, 108 connected to output lines 76, 78 of rectifier 70. If any of the inputs are energized by the closing of schematically represented switches 10, 12 and 14, a D.C. logic appears at terminal 50. Additional input lines can be monitored by the detection circuit A by including further input circuits, as shown in FIG. 1.

In the preferred embodiment of the invention, the input switches 10, 12 and 14 could be associated with the Green, Yellow and Pedestrian Walk lights of a system controlled by a traffic controller. Thus, a high logic D.C. output in line 50 would indicate that one or more functions of a traffic controller are operating in a given traffic phase, represented as phase A in FIG. 1. This sytem is shown in FIG. 6 wherein a second NORTON current responsive operational amplifier 40' is used to monitor functions as those shown in FIG. 1, but in a second traffic phase of a traffic control system, represented by phase B. It may be desirable to indicate when one of the functions shown in FIG. 1 is actuated in a traffic control system at the same time as one of these functions in another phase to indicate a conflict in the right-of-way of a traffic control system. The circuit of FIG. 6 shows a means for accomplishing this function. In accordance with this figure, the terminals of operational amplifier 40' are labeled 46', 48' and 50' to correspond with similarly numbered terminals of operational amplifier 40. The output terminals 50, 50' of the separate detecting circuits for the separate phases are connected to AND gate 120 having input terminals 122, 124 and output terminal 126. In accordance with one aspect of the invention, the AND gate 120 also includes a NORTON type current responsive operational amplifier 130 having terminals 132, 134 and 136. Terminal 136 corresponds to output terminal 126 of the AND gate 120. Biasing current from a biasing circuit 140 including resistor 142 is connected to the inverted terminal 132 of operational amplifier 130 to provide a given biasing current to terminal 132. In the normal, biased condition, a zero voltage or low logic condition exist at terminal 136 and at terminal 126 of gate 120. Terminals 50, 50' are connected to input terminals 122, 124, respectively, of gate 120 and include resistors 150, 152 which have their right end connected at line 154. This line is connected to the non-inverted terminal 134 of operational amplifier 130 through a diode 156. Resistor 142 in biasing means 140 is selected so that the $I_-$ current at terminal 132 will remain greater than the $I_+$ current at terminal 134 until a high logic exist on both lines 50, 50'. At that time, current supplied through resistors 150, 152 and diode 156 is greater than biasing current applied to terminal 132. When this happens, a high logic appears in terminal 126, 136. This indicates that there is concurrent existence of an output signal in each of the two phases of the traffic controller. This information is then used to take appropriate action in the traffic controller, such as switching the traffic controller to a flashing red or flashing yellow or accomplishing other similar function in the controller, which does not form a part of the present invention. In the illustrated embodiment, a transistor 160 has a base controlled by the logic at terminal 126. Emitter 162 is connected to a high voltage source of 15 volts in the illustrated embodiment and collector 164 is connected to ground through resistor or coil 170. When a high logic exist at the output of AND gate 120, transistor 160 is forward biased to energize coil 170. This energizes a detection device schematically represented as a light 172 connected parallel across coil 170 by a movable contact 174. Of course other detecting circuits could be used in conjunction with the high logic at the output 126 of gate 120.

NORTON type amplifiers are available on the market from various suppliers. In accordance with the preferred embodiment, LM 2900 NORTON amplifiers sold by National Semiconductor Corporation of Chicago, Illinois or MC 3301 amplifiers sold by Motorola Semiconductor Products, Inc. of Phoenix, Arizona are employed. Of course, the value of the various resistors can be changed to produce different points at which the A.C. input signal actuates the output signal of the operational amplifier. The selection of these resistors can be accomplished after understanding the operating characteristics of the present invention. In addition, the biasing current of the NORTON current responsive operational amplifier can be changed to modify the operating characteristics of the invention as defined above.

Having defined our invention, we claim:

1. An input detection circuit to provide a D.C. output signal of a selected value upon receipt of an input A.C. signal above a given value of an input line, said detection circuit including a current responsive operational amplifier having an inverted input terminal, a non-inverted input terminal and an output terminal with the output terminal assuming said selected D.C. output value at all times except when the current applied to the inverted terminal is greater than the current applied to the non-inverted terminal, a biasing current supply means connected to said inverted terminal to provide a first biasing current normally exceeding the current at said non-inverted terminal whereby no D.C. output signal substantially as great as said selected value is created at said output terminal; a first input subcircuit including a first unidirectional current device and a first resistor and having a first end connected to said input line and a second end connected to said inverted terminal, said unidirectional device being poled to allow current flow from said biasing current supply means when said input line has a voltage below said biasing current supply means; a second input subcircuit including a second unidirectional current device poled opposite to said first unidirectional device and a second resistor and having a first end connected to said input line and a second end connected to said non-inverted terminal; a second input line and a third unidirectional current device poled in the same direction as said first unidirectional device and connected at one end between said first unidirectional device and said first resistor and at the other end to said second input line and a fourth unidirectional current device poled in the same direction as said second unidirectional device and connected at one end between said second unidirectional device and said second resistor and at the other end to said second input lines whereby an A.C. signal above a given value on either of said first and second input lines will create said D.C. output signal.

2. An input detection circuit as defined in claim 1 including a third resistor in said input line.

3. An input detection circuit as defined in claim 2 including a resistor connected between said output terminal and said non-inverted terminal.

4. An input detection circuit as defined in claim 1 including a resistor connected between said output terminal and said non-inverted terminal and wherein said biasing current supply means includes a source of D.C. voltage and a resistor with said D.C. voltage being approximately at the same value as said D.C. output signal.

5. An input detection circuit as defined in claim 1 including an AND circuit having first and second inputs and an output responsive to a signal applied to said first and second inputs, menas for applying a control signal to said first input and means for applying said D.C. output signal to said second input.

6. An input detection circuit to provide a D.C. output signal of a selected value upon receipt of an input A.C. signal above a given value on an input line, said detection circuit including a current responsive operational amplifier having a first input terminal, a second input terminal and an output terminal with the output terminal assuming said selected D.C. output value at all times except when the current applied to said first terminal is greater than the current applied to said second terminal, a biasing current supply means connected to said first terminal to provide a first biasing current normally exceeding the current at said second terminal whereby no D.C. output signal substantially as great as said selected value is created at said output terminal; a first input subcircuit including a first unidirectional current device and a first resistor and having a first end connected to said input line and a second end connected to said first terminal, said unidirectional device being poled to allow current flow from said biasing current supply means when said input line has a voltage below said biasing current supply means; a second input subcircuit including a second unidirectional current device poled opposite to said first unidirectional device and a second resistor and having a first end connected to said input line and a second end connected to said second terminal; a second input line and a third unidirectional current device poled in the same direction as said first unidirectional device and connected at one end between said first unidirectional device and said first resistor and at the other end to said second input line and a fourth unidirectional current device poled in the same direction as said second unidirectional device and connected at one end between said second unidirectional device and said second resistor and at the other end to said second input lines whereby an A.C. signal above a given value on either of said first and second input lines will create said D.C. output signal.

7. An input detection circuit to provide a D.C. output signal of a selected value upon receipt of an input A.C. signal above a given value on an input line, said detection circuit including a current responsive operational amplifier having an inverted input terminal, a non-inverted input terminal and an output terminal with the output terminal assuming said selected D.C. output value at all times except when the current applied to the inverted terminal is greater than the current applied to the non-inverted terminal, a biasing current supply means connected to said inverted terminal to provide a first biasing current normally exceeding the current at said non-inverted terminal whereby no D.C. output signal substantially as great as said selected value is created at said output terminal; a first input subcircuit including a first unidirectional current device and a first resistor and having a first end connected to said input line and a second end connected to said inverted terminal, said unidirectional device being poled to allow current flow from said biasing current supply means when said input line has a voltage below said biasing current supply means; and a second input subcircuit including a second unidirectional current device poled opposite to said first unidirectional device and a second resistor and having a first end connected to said input line and a second end connected to said non-inverted terminal.

8. An input detection circuit as defined in claim 7 including a third resistor in said input line.

9. An input detection circuit as defined in claim 8 including a resistor connected between said output terminal and said non-inverted terminal.

10. An input detection circuit as defined in claim 8 wherein said biasing current supply means includes a source of D.C. voltage and a resistor with said D.C. voltage being approximately at the same value as said D.C. output signal.

* * * * *